US011683569B2

(12) United States Patent
Kim et al.

(10) Patent No.: US 11,683,569 B2
(45) Date of Patent: Jun. 20, 2023

(54) OPTICAL ASSEMBLY

(71) Applicant: Samsung Electro-Mechanics Co., Ltd., Suwon-si (KR)

(72) Inventors: Sung Han Kim, Suwon-si (KR); Han Kim, Suwon-si (KR); Young Bok Yoon, Suwon-si (KR); Seok Hwan Kim, Suwon-si (KR); Tae Ho Yun, Suwon-si (KR); Kyung Ho Lee, Suwon-si (KR); Jong Gil Won, Suwon-si (KR); Chul Kyu Kim, Suwon-si (KR); Jong Man Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 296 days.

(21) Appl. No.: 17/071,366

(22) Filed: Oct. 15, 2020

(65) Prior Publication Data

US 2021/0203815 A1 Jul. 1, 2021

(30) Foreign Application Priority Data

Dec. 27, 2019 (KR) .................. 10-2019-0176826

(51) Int. Cl.
*H05K 1/02* (2006.01)
*H04N 23/54* (2023.01)
(Continued)

(52) U.S. Cl.
CPC ............ *H04N 23/51* (2023.01); *H04N 23/54* (2023.01); *H04N 23/57* (2023.01); *H04N 23/687* (2023.01); *H05K 1/0278* (2013.01)

(58) Field of Classification Search
CPC ............... H04N 5/2253; H04N 5/2257; H04N 5/23287; H05K 1/0277–0283;
(Continued)

(56) References Cited

U.S. PATENT DOCUMENTS 9,291,832 B2    3/2016  Minamisawa et al.
2007/0019076 A1  1/2007  Teramoto et al.
(Continued)

FOREIGN PATENT DOCUMENTS

CN    102870042 A    1/2013
JP    2007-43129 A   2/2007
(Continued)

OTHER PUBLICATIONS

Korean Office Action dated Dec. 15, 2020 in counterpart Korean Patent Application No. 10-2019-0176826. (7 pages in English)(5 pages in Korean).
(Continued)

*Primary Examiner* — Paul M Berardesca
(74) *Attorney, Agent, or Firm* — NSIP Law

(57) ABSTRACT

An optical assembly includes: a camera module; at least one actuator configured to move the camera module; and a connection substrate having one end connected to the camera module such that at least a portion of the connection substrate is configured to move along with movement of the camera module. The connection substrate includes a rigidity reduction portion reducing rigidity of the connection substrate in a portion of the substrate in which distortion or warpage occurs according to the movement of the camera module.

16 Claims, 9 Drawing Sheets

(51) Int. Cl.
*H04N 23/57* (2023.01)
*H04N 23/68* (2023.01)
*H04N 23/51* (2023.01)

(58) Field of Classification Search
CPC ........ H05K 1/147; H05K 1/148; H05K 1/189; H05K 2201/05–058; G03B 5/02; G03B 5/06; G03B 2205/00–0084; G03B 30/00; G02B 27/64; G02B 27/646; G08B 13/1961
See application file for complete search history.

(56) References Cited

U.S. PATENT DOCUMENTS

| | | | |
|---|---|---|---|
| 2007/0077805 A1* | 4/2007 | Nomura | G03B 17/04 348/E5.046 |
| 2010/0007757 A1 | 1/2010 | Nakayama | |
| 2010/0166402 A1 | 7/2010 | Lee et al. | |
| 2011/0103782 A1 | 5/2011 | Tsuruta et al. | |
| 2013/0182325 A1 | 7/2013 | Minamisawa et al. | |
| 2018/0013938 A1* | 1/2018 | Choi | H04N 5/2253 |
| 2018/0120531 A1 | 5/2018 | Sasaki et al. | |
| 2018/0284476 A1* | 10/2018 | Minamisawa | G03B 5/06 |
| 2019/0278101 A1* | 9/2019 | Minamisawa | H04N 5/2253 |
| 2020/0329179 A1* | 10/2020 | Yeh | H04N 5/2253 |

FOREIGN PATENT DOCUMENTS

| | | |
|---|---|---|
| JP | 2011-232708 A | 11/2011 |
| JP | 2018-77453 A | 5/2018 |
| KR | 10-2012-0086942 A | 8/2012 |
| KR | 10-2018-0005084 A | 1/2018 |
| KR | 10-1953224 B1 | 5/2019 |

OTHER PUBLICATIONS

Chinese Office Action dated Jan. 6, 2022 in corresponding Chinese Patent Application No. 202011527785.X (5 pages in English and 8 pages in Chinese).

\* cited by examiner

OPTICAL ASSEMBLY

CROSS-REFERENCE TO RELATED APPLICATIONS

This application claims the benefit under 35 USC § 119(a) of Korean Patent Application No. 10-2019-0176826 filed on Dec. 27, 2019 in the Korean Intellectual Property Office, the entire disclosure of which is incorporated herein by reference for all purposes.

BACKGROUND

1. Field

This following description relates to an optical assembly.

2. Description of Related Art

With the widespread use of image capturing devices such as digital cameras or mobile phones, there is an increasing consumer need to capture high-quality still images and moving images.

For example, an optical image stabilizer is increasingly employed in an image capturing device to prevent resolution of an image from being reduced by user hand-shake.

Such an optical image stabilizer is used in a camera module capturing an image of a subject. In a conventional case, an imaging sensor, as a CCD or a CMOS sensor, or an optical lens, is moved to compensate for hand-shake or shake of a camera module resulting from external vibrations or impacts.

According to a recently developed technology, the entire camera module offsets user hand-shake or is pivotally rotated or tilted to follow a moving subject. However, when a camera module itself is moved, a connection substrate electrically connecting the camera module and an external entity to each other should be moved together with the camera module. Therefore, the connection substrate may hinder the movement of the camera module.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an optical assembly includes: a camera module; at least one actuator configured to move the camera module; and a connection substrate having one end connected to the camera module such that at least a portion of the connection substrate is configured to move along with movement of the camera module. The connection substrate includes a rigidity reduction portion reducing rigidity of the connection substrate in a portion of the substrate in which distortion or warpage occurs according to the movement of the camera module.

The optical assembly may further include: a housing accommodating the camera module; and a hinge portion disposed on a bottom surface of the housing and connecting the camera module and the housing to each other such that the camera module is pivotally rotatable.

The optical assembly of claim 2, wherein the connection substrate may further include: a first section disposed around the hinge portion in a form covering the hinge portion; and a second section extending outwardly of the housing from the first section.

The hinge portion may connect the camera module and the housing to each other such that the camera module is configured to move in translation motion in a direction parallel to the bottom surface of the housing.

The second section may be formed in a zigzag shape.

The rigidity reduction portion may be disposed in a portion of the second section extending in a direction orthogonal to a direction in which the camera module moves in the translation motion.

The rigidity reduction portion may include at least one slit penetrating through the connection substrate and having a length extending in the direction orthogonal to the direction in which the camera module moves in the translation motion.

The first section may include a curved portion disposed around the hinge portion in a curved shape, and disposed in a space between the camera module and the bottom surface of the housing. The rigidity reduction portion may be disposed in the curved portion.

The rigidity reduction portion may be disposed in a portion of the curved portion disposed on a side of the camera module.

The hinge portion may have a cylindrical shape. The first section may include a straight portion formed in a straight line shape and extending in a length direction of the hinge portion. The rigidity reduction portion may be disposed in a region of the straight portion extending parallel to the hinge portion.

The straight portion may be disposed on the bottom surface of the housing.

The rigidity reduction portion may include at least one slit penetrating through the connection substrate and formed in a length direction of the connection substrate.

A length of the slit may be greater than a width of the connection substrate.

The connection substrate may further include an insulating layer and a wiring pattern disposed on the insulating layer. The wiring pattern may be disposed on only one surface of the insulating layer in a region of the insulating layer on which the rigidity reduction portion is not disposed. The wiring pattern may be disposed on the one surface of the insulating layer and another surface of the insulating layer, in a region of the insulating layer on which the rigidity reduction portion is disposed.

The connection substrate may further include an interlayer connection conductor connecting a part of the wiring pattern disposed on the one surface of the insulating layer and a part of the wiring pattern disposed on the other surface of the insulating layer to each other.

The connection substrate may further include a rigid substrate portion in which rigid insulators are stacked on the one surface of the insulating layer and the other surface of the insulator.

The rigid substrate portion may be formed in a region of the connection substrate in which the interlayer connection conductor is disposed.

The connection substrate may further include a first connection substrate and a second connection substrate having a same configuration. The first connection substrate and the second connection substrate may be disposed to be point-symmetric to each other.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depictions of elements in the drawings may be exaggerated for clarity, illustration, and convenience.

DETAILED DESCRIPTION

Figure 1:
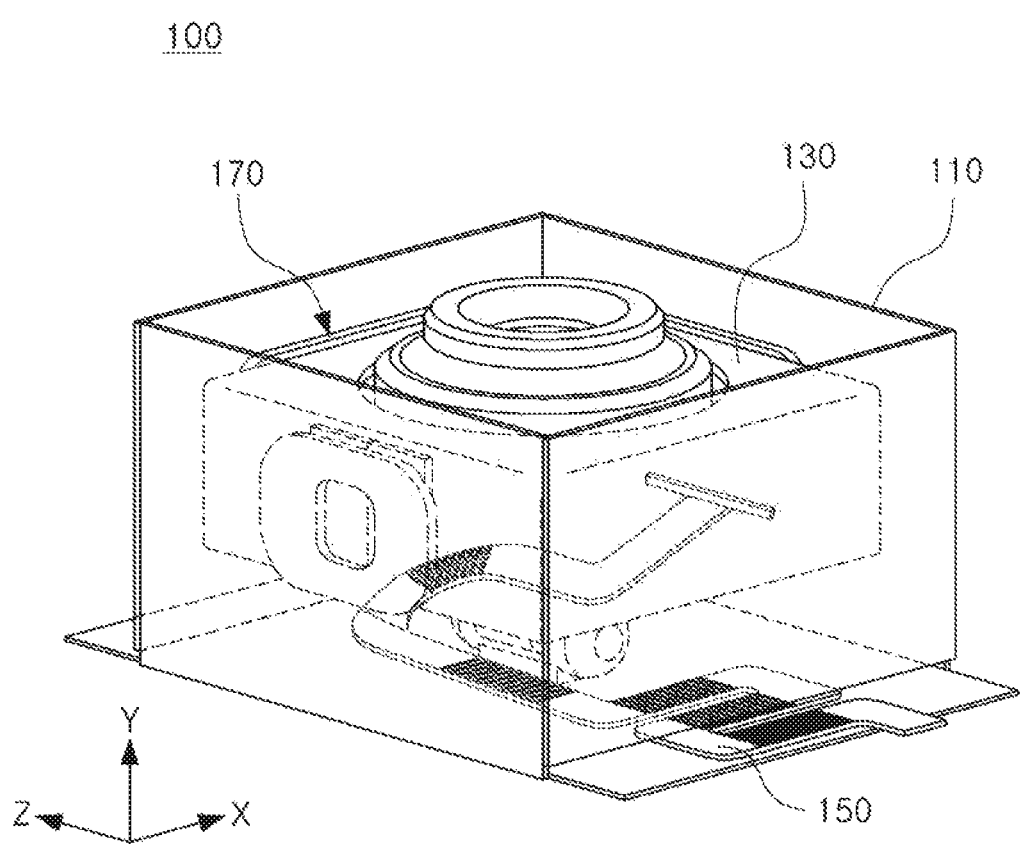
FIG. 1 is a perspective view of an optical assembly, according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

Figure 2:
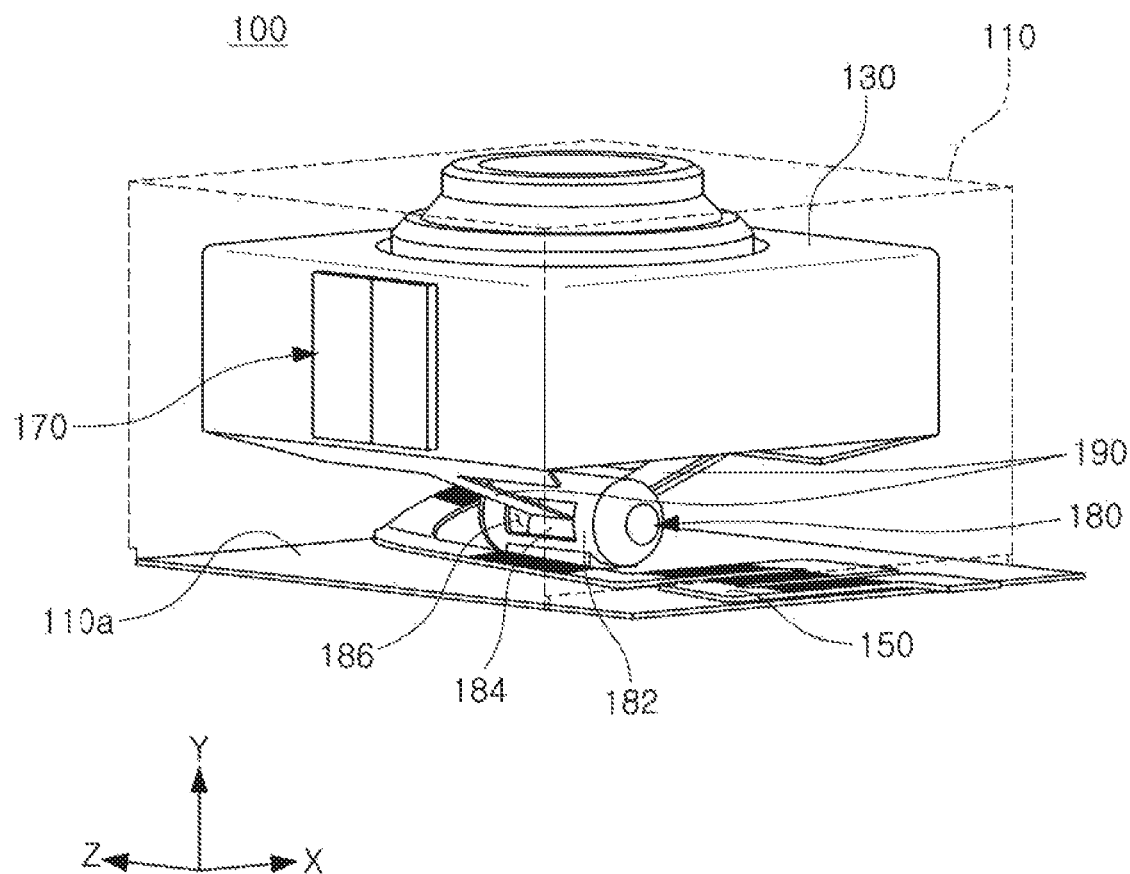
FIG. 2 is a cutaway perspective view of a portion of a sidewall of a housing illustrated in FIG. 1.
Figure 3:
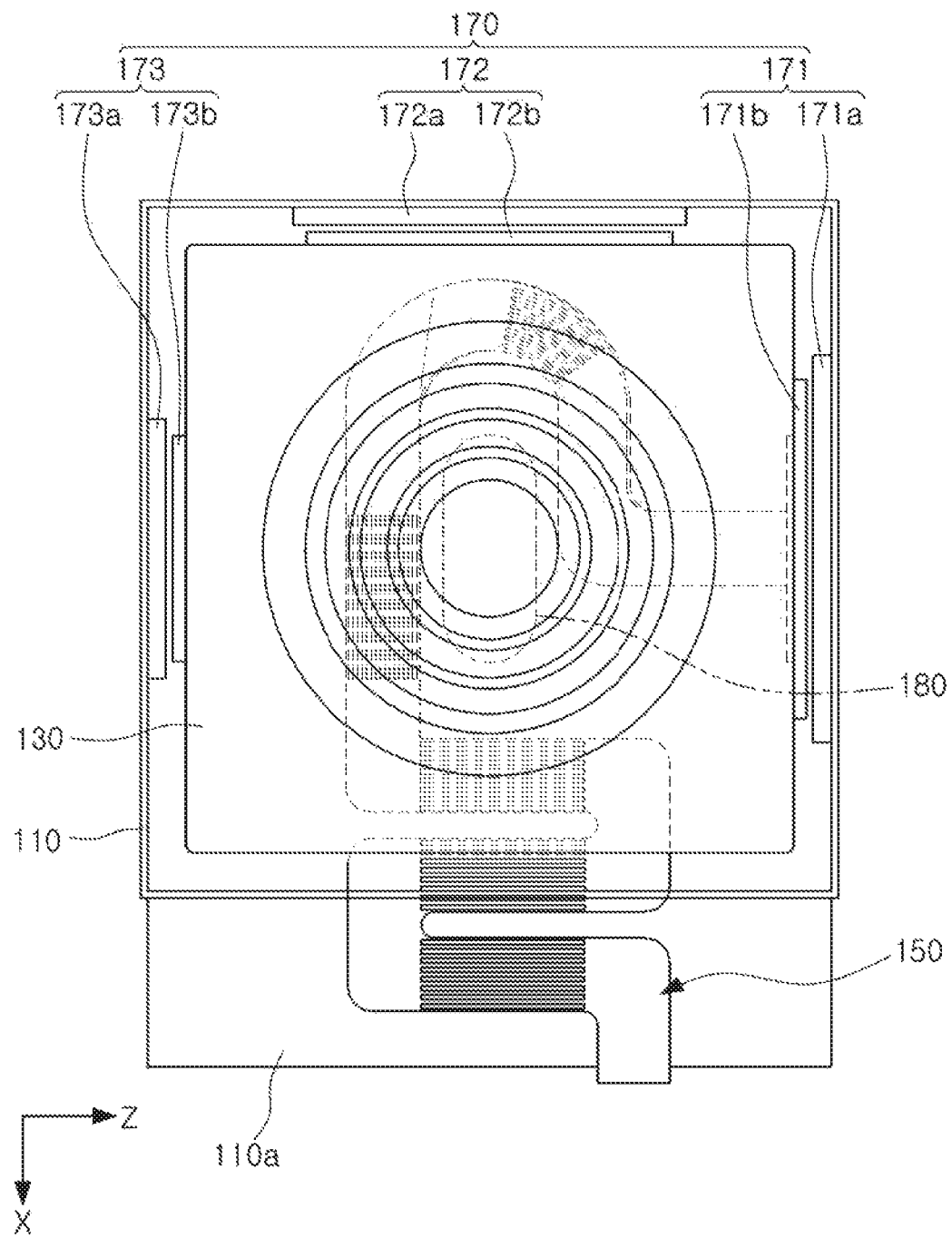
FIG. 3 is a plan view of the optical assembly illustrated in FIG. 1.

FIG. 1 is a perspective view of an optical assembly 100, according to an example. FIG. 2 is a cutaway perspective view of a portion of a sidewall of a housing 110 illustrated in FIG. 1. FIG. 3 is a plan view of the optical assembly 100.

Referring to FIGS. 1 to 3, the optical assembly 100 may include, for example, the housing 110, a camera module 130, and a connection substrate 150.

The housing 110 may form an entire exterior of the optical assembly 100, and accommodates the camera module 130 and the connection substrate 150 therein. In this example, the camera module 130 may be disposed within the housing 110, and may be pivotally rotatable with respect to the housing 110. Therefore, the housing 110 has an accommodation space in which the camera module 130 is pivotally rotatable.

The camera module 130 may include a lens barrel and an image sensor, and may be electrically connected to elements outside of the optical assembly 100 by the connection substrate 150, which is coupled to a lower surface of the camera module 130.

As described above, the camera module 130 is coupled to the housing 110 to be pivotally rotatable in the housing 110. As shown in FIGS. 2 and 3, to enable the pivotal rotation of the camera module 130, the optical assembly 100 may include a hinge portion 180 and support portions 190.

The hinge portion 180 is, for example, disposed on a bottom surface 110a of the housing 110 to connect the camera module 130 and the housing 110 to each other such that the camera module 130 may pivotally move or move linearly. Accordingly, the camera module 130 is configured to pivotally rotate about the hinge portion 180 and to move linearly in a length direction (a Z-axis direction) of the hinge portion 180.

The hinge portion 180 may include a hollow cylindrical bracket 182 and a spherical ball hinge 184, as shown in FIG. 2.

The bracket 182 is fixed to the bottom surface 110a of the housing 110 and includes a pair of openings 186 on an external circumferential surface.

The ball hinge 184 is disposed to be movable in a length direction of the bracket 182 in an internal space of the bracket 182. Therefore, the ball hinge 184 is disposed to be rotatable and to be linearly movable in the length direction of the bracket 182 in the internal space of the bracket 182.

The support portions 190 connect the hinge portion 180 and the camera module 130 to each other, and support the camera module 130.

The support portions 190 may be formed in a rod shape, and may each have one end fastened to the ball hinge 184 through a respective opening 186, and another end fastened to a lower surface of the camera module 130.

Two support portions 190 may be disposed on opposite sides of the hinge portion 180 to support opposite sides of the lower surface of the camera module 130, respectively. Accordingly, the camera module 130 is disposed to be spaced apart from the bottom surface 110a of the housing 110 by a predetermined distance by the hinge portion 180 and the support portions 190.

As described above, the hinge portion 180 is provided such that the camera module 130 is configured to be pivotally rotatable and to be movable in translation motion (e.g., linearly movable) in a direction parallel to the bottom surface 110a of the housing 110.

In addition, the optical assembly 100 may include an actuator 170 configured to drive movement of the camera module 130.

The actuator 170 is disposed between the camera module 130 and the housing 110 and is operable to pivotally rotate or linearly move the camera module 130.

The actuator 170 may include a first actuator 171 configured to pivotally rotate the camera module 130 about a Z axis (e.g., using the Z axis as a rotation axis), a second actuator 172 configured to pivotally rotate the camera module 130 about an X axis (e.g., using the X axis as a rotation axis), and a third actuator 173 configured to linearly move the camera module 130 in the Z-axis direction.

The first, second, and third actuators 171, 172, and 173 may include a first coil portion 171a, a second coil portion 172a, and a third coil portion 173a, respectively, and a first magnetic portion 171b, a second magnetic portion 172b, and a third magnetic portion 173b, respectively. The first, second, and third coil portions 171a, 172a, and 173a are spaced apart from each other at regular intervals, and the first, second, and third magnetic portions 171b, 172b, and 173b are spaced apart from each other at regular intervals. The first, second, and third coil portions 171a, 172a, and 173a and the first, second, and third magnetic portions 171b, 172b, and 173b face each other, respectively. In this example, the first, second, and third coil portions 171a, 172a, and 173a are disposed on an internal wall of the housing 110, and the first, second, and third magnetic portions 171b, 172b, and 173b are disposed on an external wall of the camera module 130. However, the disclosure herein is not limited to the foregoing configuration, and the first, second, and third coil portions 171a, 172a, and 173a and the first, second, and third magnetic portions 171b, 172b, and 173b may be disposed in opposite positions to each other, as necessary.

The first actuator 171 and the second actuator 172 may be configured such that attractive force and repulsive force act between the first, second, and third coil portions 171a, 172a, and 173a and the first, second, and third magnetic portions 171b, 172b, and 173b, respectively, to rotate the camera module 130. The third actuator 173 may linearly move the camera module 130 using Lorentz force. Since such a linear movement method is widely applied to an Optical Image Stabilization (01S) device, a detailed description thereof will be omitted.

The actuator 170 may move the camera module 130 in response to user hand-shake information to compensate for image shake caused by the user hand-shake. Thus, image quality may be improved.

Since the connection substrate 150 of this example has one end connected to the camera module 130, at least a portion of the connection substrate 150 is moved together with the camera module 130, according to the movement of the camera module 130, such as pivotal rotation or linear movement. Accordingly, a flexible printed circuit board, or a printed circuit board including both a rigid printed circuit board and a flexible printed circuit board, may be used as the connection substrate 150 to accommodate repeated movements of the camera module 130.

Figure 4:
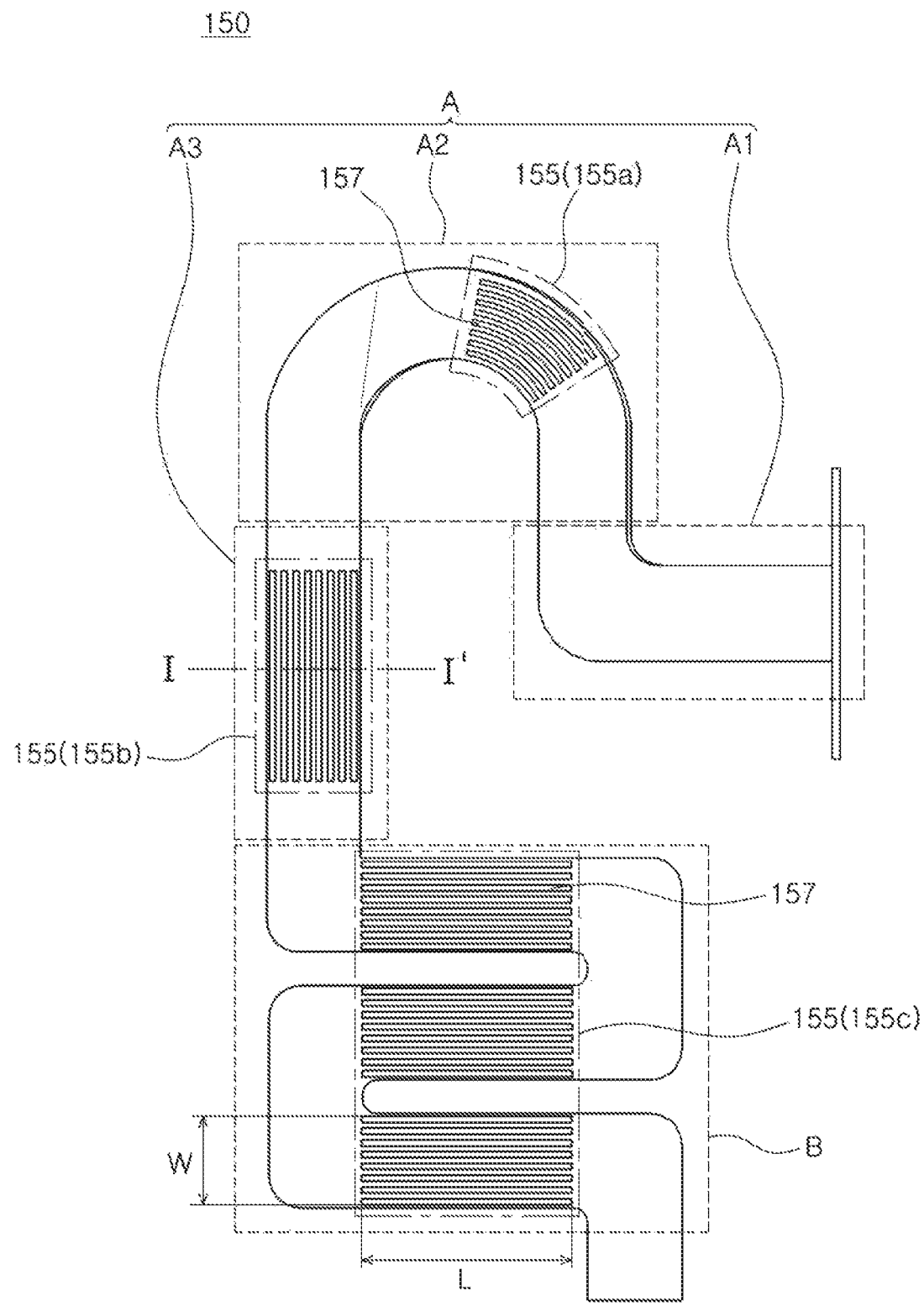
FIG. 4 is a plan view of a connection substrate illustrated in FIG. 3.
Figure 5:
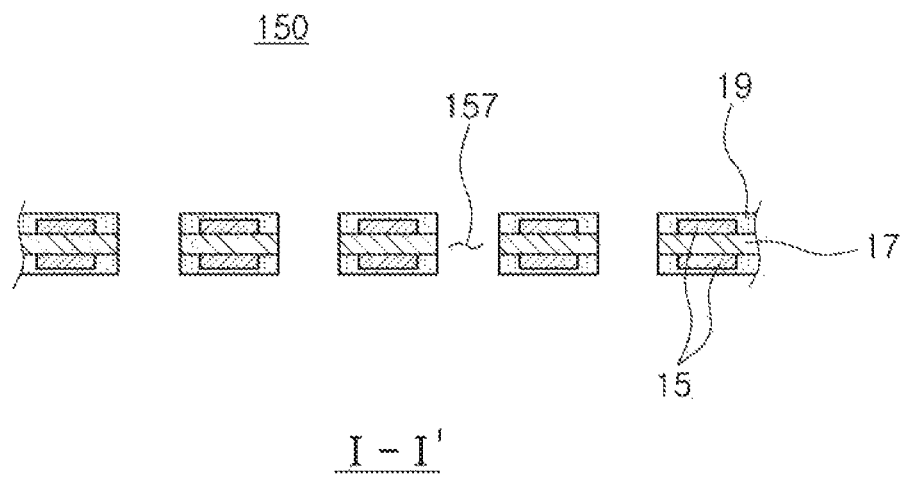
FIG. 5 is a cross-sectional view taken along line I-I' in FIG. 4.

FIG. 4 is a plan view of the connection substrate 150. FIG. 5 is a cross-sectional view taken along line I-I' in FIG. 4.

Referring to FIGS. 4 and 5, the connection substrate 150 may be a printed circuit board in which at least one insulating layer 17 and at least one wiring layer 15 are stacked. For example, the connection substrate 150 may be a double-sided substrate in which a wiring layer 15 is formed on two opposite surfaces (e.g., an upper surface and a lower surface) of a single insulating layer 17.

A material of the insulating layer 17 is not necessarily limited. For example, an insulating material may be used as the material of the insulating layer 17. The insulating material may be a thermosetting resin such as an epoxy resin, a thermoplastic resin such as a polyimide resin, or a resin in which the thermosetting resin or the thermoplastic resin is mixed with an organic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like.

The wiring layer 15 is stacked on the insulating layer 17 and includes a wiring pattern electrically connected to elements outside of the camera module 130.

A material of the wiring layer 15 may be a conductive material such as copper (Cu), aluminum (Al), silver (Ag), tin (Sn), gold (Au), nickel (Ni), lead (Pb), titanium (Ti), or an alloy of (Cu), aluminum (Al), silver (Ag), tin (Sn), gold (Au), nickel (Ni), lead (Pb), or titanium (Ti).

Interlayer connection conductors for interconnection of the stacked wiring layers 15 may be disposed in the insulating layer 17.

In addition, an insulating protective layer 19 may be disposed on a surface of the connection substrate 150. The insulating protective layer 19 may be formed by attaching a polyimide film, including an adhesive layer, on the wiring layer 15.

The insulating protective layer 19 may be disposed in a form covering both the insulating layer 17 and the wiring layer 15 on an upper surface and a lower surface of the insulating layer 17, and thus, protects the wiring layer 15 on the insulating layer 17.

As illustrated in FIG. 4, the connection substrate 150 may include a first section A disposed around the hinge portion 180, and a second section B formed in a zigzag shape.

The first section A is disposed on a side of the one end of the connection substrate 150 connected to the camera module 130, and is disposed around the hinge portion 180 in a form covering the hinge portion 180.

More specifically, the first section A includes a first straight portion A1 disposed along one support portion 190, a curved portion A2 formed in a curved shape along the hinge portion 180, and a second straight portion A3 connecting the curved portion A2 and the second section B to each other.

The first straight portion A1 may be attached to a lower surface of the one support portion 190. Accordingly, the first straight portion A1 may be moved integrally with the support portions 190.

The second straight portion A3 may be disposed such that a portion or entirety of the second straight portion A3 is disposed to be adjacent to the bottom surface 110a of the housing 110, or at least a portion of the second straight portion A3 is disposed to be in contact with the bottom surface 110a of the housing 110. The second straight portion A3 is formed in a straight shape and is disposed parallel to the hinge portion 180 along a length direction of the hinge portion 180.

The curved portion A2 is disposed around the hinge portion 180 in a curved shape and is disposed in the air between the camera module 130 and the bottom surface 110a of the housing 110 to connect the first straight portion A1 and the second straight line A3 to each other. The entirety of the curved portion A2 may be disposed in the air, or in open space above the bottom surface 110a of the housing 110. In certain case, a portion of the curved portion A2 may be disposed to be in contact with the bottom surface of the housing 110.

The curved portion A2 is a portion in which the movement of the connection substrate 150 mainly occurs during pivotal rotation of the camera module 130. Therefore, the connection substrate 150 is disposed in a position spaced apart from the hinge portion 180 by a predetermined distance so as not to be in contact with the hinge portion 180 when the connection substrate 150 is moved.

The second section B extends outwardly of the housing 110 from the second straight portion A3. As illustrated in FIG. 4, the second section B is formed in a zigzag or meander shape.

The second section B is provided to correspond to the linear movement of the camera module 130. In this example, the camera module 130 is configured to move in translation motion in a length direction (a Z-axis direction) of the hinge portion 180. Accordingly, the second section B is formed in a meander shape, in which at least a portion of the second section B is disposed in a direction orthogonal to the Z-axis direction, to improve flexibility of the connection substrate 150 in the Z-axis direction when the camera module 130 moves.

In addition, the connection substrate 150 may include one or more rigidity reduction portions 155.

The one or more rigidity reduction portions 155 are provided to reduce the rigidity of the connection substrate 150 such that the connection substrate 150 is flexibly moved according to the movement of the camera module 130. Therefore, the one or more rigidity reduction portions 155 may be provided in portion(s) of the connection substrate 150 in which distortion or warpage occurs when the connection substrate 150 is moved.

In this example, the one or more rigidity reduction portions 155 include at least one slit 157. The slit 157 is formed in a shape of a linear through-hole penetrating through the connection substrate 150.

In this example, the slit 157 is disposed in a length direction of the connection substrate 150 and is provided with a plurality of slits disposed side by side. However, the disclosure herein is not limited to the aforementioned configuration and various modified examples such as an example in which only one slit 157 is formed, an example in which slits 157 are formed in various shapes rather than a linear shape, and the like, may be implemented.

When a length L of the slit 157 is excessively short, it may be difficult to provide required flexibility. Therefore, the slit 157 of this example is formed to have a length L greater than a width W of the connection substrate 150. However, the disclosure herein is not limited to such a configuration, and in a first rigidity reduction portion 155a formed in the curved portion A2, the slit 157 may be formed to have a length L partially smaller than the width W of the connection substrate 150.

In this example, the one or more rigidity reduction portions 155 include the first rigidity reduction portion 155a disposed on the curved portion A2 as well as a second rigidity reduction portion 155b disposed on the second straight portion A3. The first rigidity reduction portion 155a is disposed in an upper portion of the curved portion A2. For example, the first rigidity reduction portion 155a of the curved portion A2 may be disposed in a portion disposed on a side of the camera module 130 when the curved portion A2 is divided into two sections.

In the second straight portion A3, the second rigidity reduction portion 155b is disposed in a portion in which distortion occurs most frequently. In the case of the second straight portion A3, distortion occurs most frequently in a center portion or a portion disposed to face the hinge portion 180 and disposed to be parallel to the hinge portion 180. Therefore, the second straight portion A3 is disposed in a center portion of the second straight portion A3 in a length direction or a portion of the second straight portion A3 extending parallel to the hinge portion 180.

The second section B has flexibility in the Z-axis direction. In this case, higher flexibility may be provided when the slit 157 is formed to be parallel to an X axis, orthogonal to the Z-axis direction. Therefore, in the second section B, third rigidity reduction portions 155c are disposed in sections extending in a direction orthogonal to the Z-axis direction, (x-axis direction).

Figure 6:
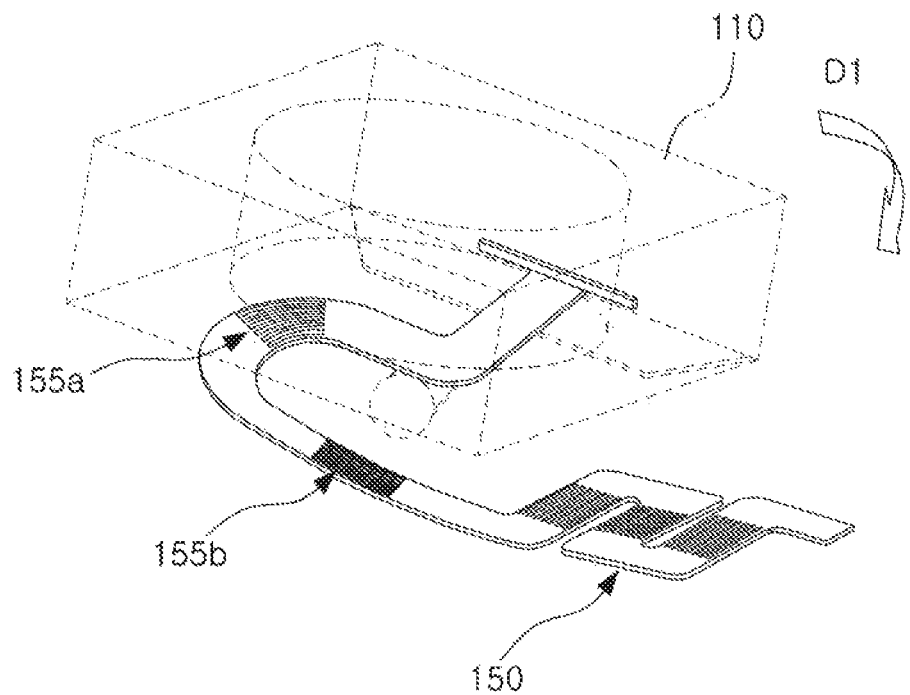
FIGS. 6 to 8 illustrate deformed states of the connection substrate of FIG. 4, according to an example.
Figure 7:
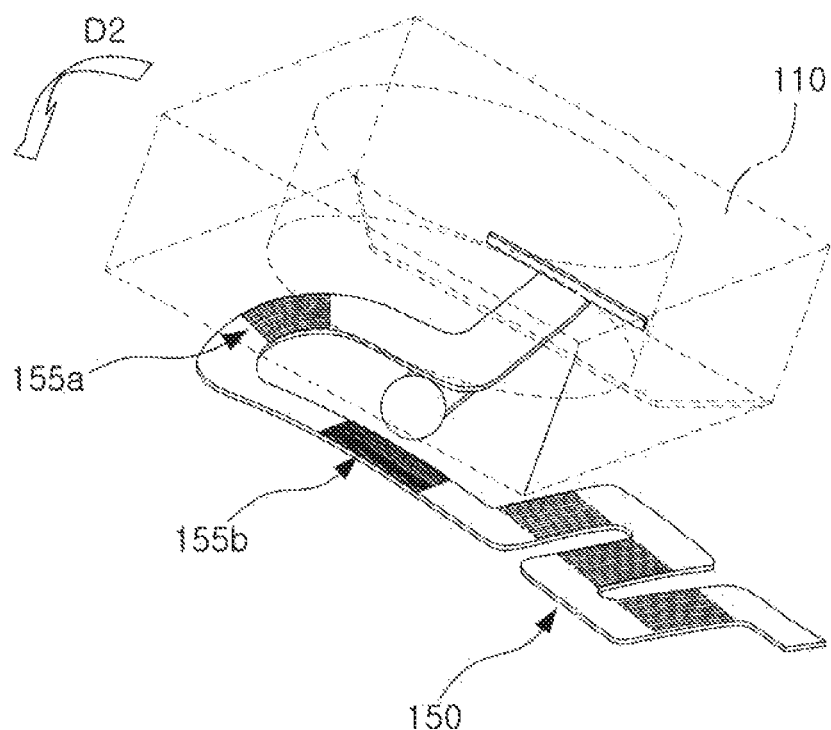
Figure 8:
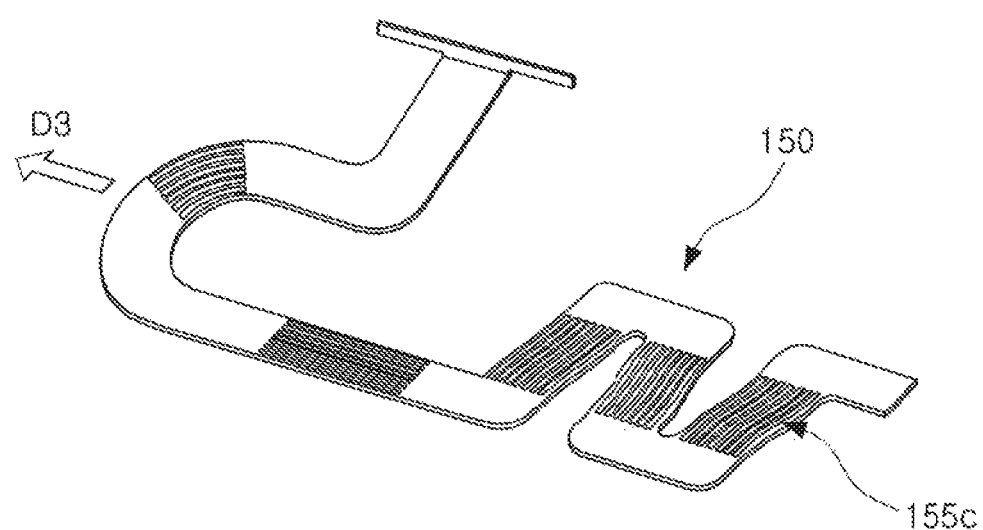

FIGS. 6 to 8 illustrate deformed states of the connection substrate 150, according to an example.

FIG. 6 illustrates the connection substrate 150 deformed when the camera module 130 rotates in a direction D1. FIG. 7 illustrates a deformed state of the connection substrate 150 when the camera module 130 rotates in a direction D2.

Referring to FIGS. 6 and 7, it will be understood that, when the camera module 130 rotates pivotally, the most significantly deformed portions of the connection substrate are a portion in which the first rigidity reduction portion 155a of the curved portion A2 is disposed, and a portion in which the second rigidity reduction portion 155b of the second straight portion A3 is disposed. Also, it will be understood that the connection substrate 150 is flexibly deformed by the first and second rigidity reduction portions 155a and 155b.

FIG. 8 illustrates a state in which the connection substrate 150 is deformed when the camera module 130 moves in translation motion in a direction D3. Referring to FIG. 8, it will be understood that when the camera module 130 moves in translation motion, a second section B extends in the direction D3, which corresponds to the movement of the camera module 130. In this case, the connection substrate 150 is flexibly deformed through the third rigidity reduction portions 155c disposed in the second section B.

In the optical assembly 100 configured as described above, the connection substrate 150 may move flexibly when the camera module 130 pivotally moves or moves in translation motion. Thus, interference or resistance to the movement of the camera module 130 may be significantly reduced.

The connection substrate 150 may be configured in various forms.

Figure 9:
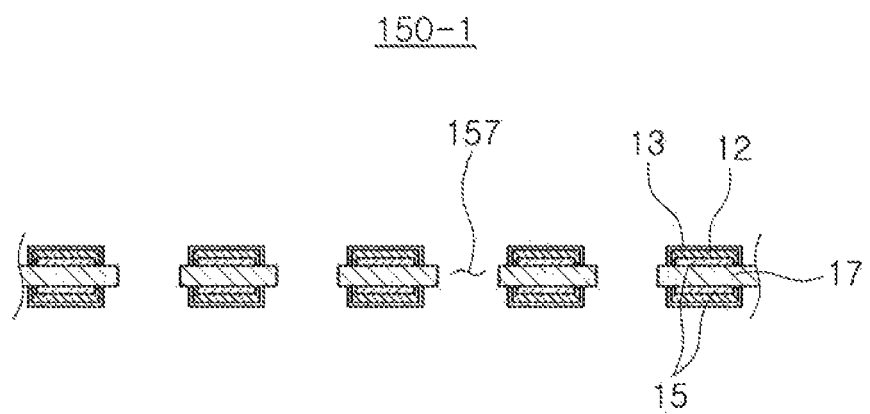
FIG. 9 is a schematic cross-sectional view of a connection substrate, according to an example.

FIG. 9 is a schematic cross-sectional view of a connection substrate 150-1, according to an example.

Referring to FIG. 9, the connection substrate 150-1 may be prepared by forming a wiring layer 15 of copper, or the like, on the two opposite surfaces of the insulating layer 17, which may be formed of polyimide, or the like, and sequentially forming a nickel (Ni) plating layer 12 and a gold (Au) plating layer 13 on a surface of the wiring layer 15.

In this example, since oxidation of the wiring layer 15 is suppressed by the nickel (Ni) and gold (Au) plating layers 12 and 13, the insulating protective layer 19 of FIG. 5 may be omitted. Thus, flexibility may be increased to be higher than the flexibility of the connection substrate 150 illustrated in FIG. 5.

In a connection substrate, the wiring layer 15 may be provided as a single layer. In this case, a thickness is decreased to improve flexibility of the connection substrate. However, when the one or more rigidity reduction portions 155 are formed on a corresponding connection substrate, the connection substrate should be formed to have a significantly large width because a wiring pattern should be disposed between slits 157. Thus, an overall size of an optical assembly may be increased.

Accordingly, the connection substrates 150 and 150-1 employ a double-sided substrate in which wiring layers 15 are disposed on both surfaces of the insulating layer 17, as illustrated in FIGS. 5 and 9.

However, when a connection substrate is formed as a double-sided substrate, rigidity may be increased because a thickness of the connection substrate is increased, as compared with the case in which the wiring layer 15 is provided as a single layer.

Figure 10A:
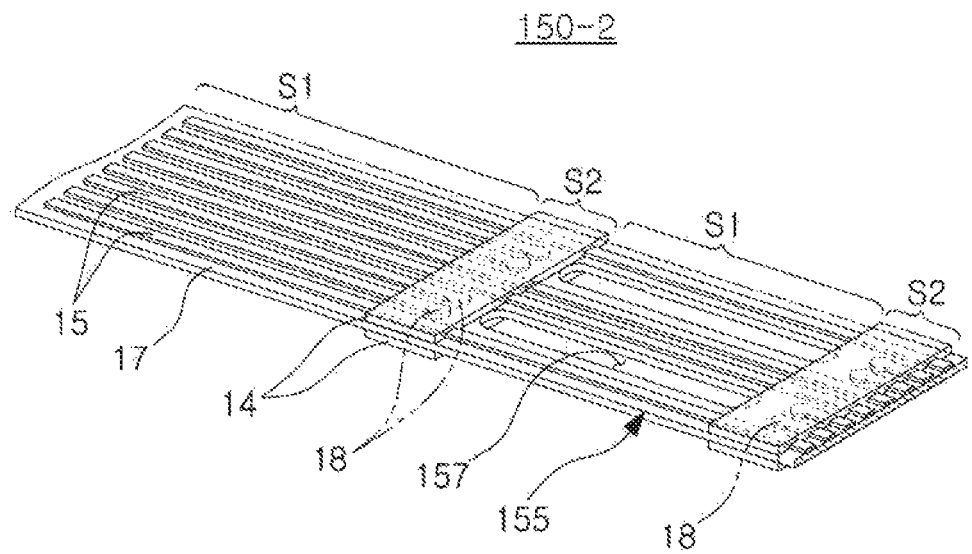
FIG. 10A and FIG. 10B are schematic perspective views of connection substrates, according to examples.
Figure 10B:
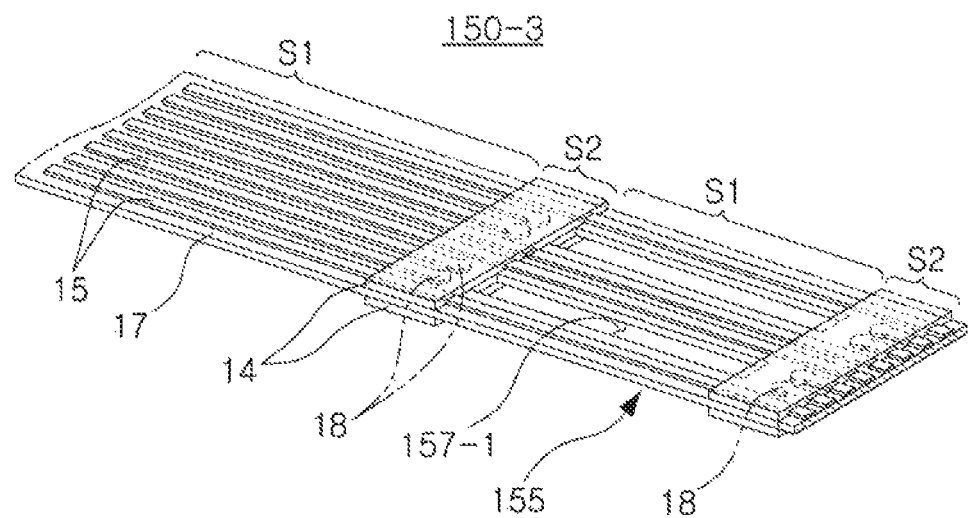

Therefore, according to examples illustrated in FIGS. 10A and 10B, a wiring pattern may be disposed to be distributed on both surfaces of the insulating layer 17 only in regions in which the one or more rigidity reduction portions 155 are disposed.

FIG. 10A and FIG. 10B are schematic perspective views of connection substrates 150-2 and 150-3, respectively, according to an examples.

Referring to FIG. 10A, in the connection substrate 150-2, wiring patterns constituting a wiring layer 15 are all disposed on only one surface of the insulating layer 17 in region(s) in which the one or more rigidity reduction portions 155 are not disposed. Certain wiring patterns among the wiring patterns are disposed on the other surface of the insulating layer 17 in region(s) in which the one or more rigidity reduction portions 155 are disposed. That is, the wiring patterns are disposed on both surfaces of the insulating layer 17 in the region(s) in which the one or more rigidity reduction portions 155 are disposed. To this end, a plurality of interlayer connection conductors 18 may be disposed on the insulating layer 17 to connect the wiring pattern on the one surface of the insulating layer 17 and the wiring pattern on the other surface of the insulating layer 17 to each other.

Various experiments were performed to confirm that the connection substrate 150-2 of this example had higher flexibility in a portion in which the rigidity reduction portion 155 was formed than in a portion in which wiring patterns were all disposed on the one surface of the insulating layer 17. Therefore, an example in which a rigidity reduction portion is formed throughout an entirety of a connection substrate may be implemented.

However, when the slit 157 is formed in the entirety of a connection substrate, it may be difficult to treat the connection substrate and there is a high possibility that the connection substrate may be damaged during the treatment of the connection substrate. Therefore, in the connection substrate 150-2, the one or more rigidity reduction portions 155 are disposed only in portion(s) in which the connection substrate 150-2 is significantly moved or in which distortion and warpage frequently occur.

In addition, the connection substrate 150-2 includes a flexible substrate portion S1 and a rigid substrate portion S2.

The flexible substrate portion S1 is a section including a flexible printed circuit board described in the above embodiments.

The rigid substrate portion S2 is a section in which insulators 14 having rigidity are stacked above and below the insulating layer 17. Therefore, the rigid substrate portion S2 is formed to have a higher thickness than the flexible substrate portion S1 and to have higher rigidity than the flexible substrate portion S1.

The rigid substrate portion S2 may be formed in a region in which the interlayer connection conductor 18 is disposed. If the interlayer connection conductor 18 were to be formed in the flexible substrate portion S1, the portion in which the interlayer connection conductor 18 is disposed could be easily damaged due to movement of the connection substrate, or the like. However, when the portion in which the interlayer connection conductor 18 is disposed is formed of the rigid substrate portion S2 as in the connection substrate 150-2, the interlayer connection conductor 18 is tightly connected to the connection substrate 150-2 by the insulator 14 having rigidity and, thus, the portion in which the interlayer connection conductor 18 is disposed may be resistant to damage due to movement of the connection substrate 150-2.

In a case in which damage may be prevented even when the interlayer connection conductor 18 is disposed in the flexible substrate portion S1, the insulators 14 having rigidity may be omitted.

In a process of manufacturing the connection substrate 150-2, the rigidity reduction portion 155 may be formed after the rigid substrate portion S2 is formed or before the rigid substrate portion S2 is formed.

When the rigidity reduction portion 155 is formed after the rigid substrate portion S2 is formed, an edge portion of the slit 157 may be formed as a rounded edge, as illustrated in FIG. 10A. Such a configuration is intended to prevent damage to the insulating layer 17 during formation of the slit 157.

On the other hand, referring to the connection substrate 150-3 of FIG. 10B, when the rigidity reduction portion 155 is formed before the rigid substrate portion S2 is formed, a slit 157-1 is formed on the insulating layer 17, and the insulator 14 is then stacked on both surfaces of the insulating layer 17. In this case, since the insulator 14 may cover a portion of the slit 157-1 and may be stacked on the insulating layer 17, an edge of the slit 157-1 may be formed to have an angled shape by the insulator 14, as illustrated in FIG. 10B.

In this case, a short side of the slit 157-1 may be defined by the rigid substrate portion S2.

In the examples of FIGS. 10A and 10B, the rigid substrate portion S2 is formed only in the region in which the interlayer connection conductor 18 is disposed. However, the disclosure herein is not limited to such a configuration, and the rigid substrate portion S2 may be selectively formed in a rigidity-required portion in a region other than the region in which the interlayer connection conductor 18 is disposed.

An optical assembly according to the disclosure herein is not limited to the above-described embodiments, and various modifications may be made.

Figure 11:
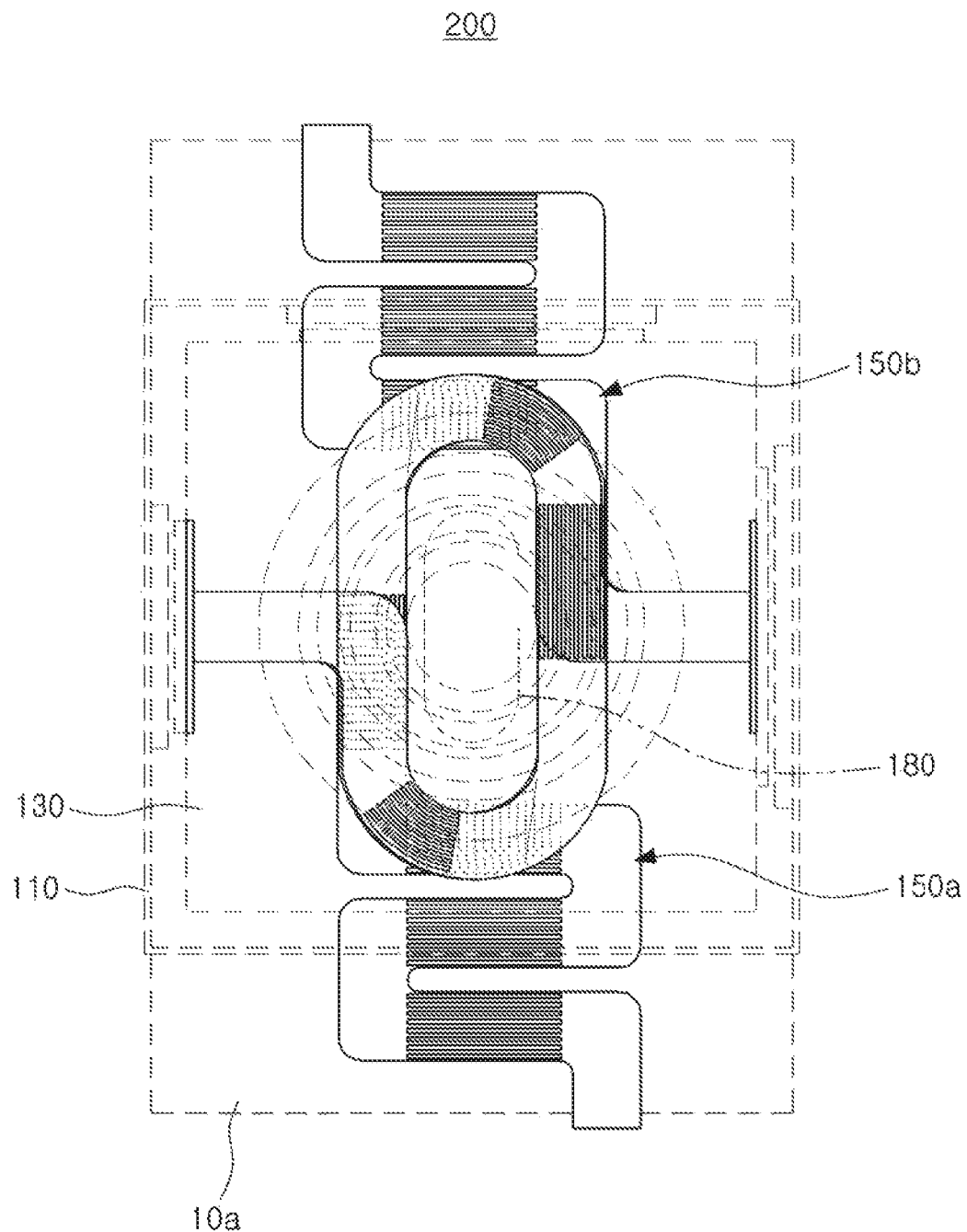
FIG. 11 is a schematic plan view of an optical assembly, according to an example.

FIG. 11 is a schematic plan view of an optical assembly 200, according to an example.

Referring to FIG. 11, the optical assembly 200 may include two connection substrates 150a and 150b. The first connection substrate 150a may have the same configuration as in the above-described embodiments. In addition, the second connection substrate 150b may be disposed to be point-symmetric to the first connection substrate 150a.

Therefore, the first connection substrate 150a and the second connection substrate 150b are disposed in such a manner that a first straight portion A1 (FIG. 4) is attached to each of the two support portions 190 (FIG. 2), and a curved portion of the second connection substrate 150b covers the hinge portion 180 (FIG. 2) in a direction opposite to the direction in which the first connection substrate 150a covers the hinge portion 180.

As described above, various modifications may be made to the optical assemblies described herein.

An optical assembly according to the disclosure herein may significantly reduce interference or resistance to movement of a camera module because a connection substrate connected to the camera module may move flexibly when the camera module pivotally rotates or moves in translation motion.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An optical assembly, comprising:
   a camera module;
   a housing accommodating the camera module;
   a hinge portion disposed on a bottom surface of the housing and connecting the camera module and the housing to each other such that the camera module is pivotally rotatable;
   at least one actuator configured to move the camera module; and
   a connection substrate having one end connected to the camera module such that at least a portion of the connection substrate is configured to move along with movement of the camera module,
   wherein the connection substrate comprises a rigidity reduction portion reducing rigidity of the connection substrate in a portion of the substrate in which distortion or warpage occurs according to the movement of the camera module, and
   wherein the hinge portion connects the camera module and the housing to each other such that the camera module is configured to move in translation motion in a direction parallel to the bottom surface of the housing.

2. The optical assembly of claim 1, wherein the connection substrate further comprises:
   a first section disposed around the hinge portion in a form covering the hinge portion; and
   a second section extending outwardly of the housing from the first section.

3. The optical assembly of claim 2, wherein the second section is formed in a zigzag shape.

4. The optical assembly of claim 3, wherein the rigidity reduction portion is disposed in a portion of the second section extending in a direction orthogonal to a direction in which the camera module moves in the translation motion.

5. The optical assembly of claim 4, wherein the rigidity reduction portion comprises at least one slit penetrating through the connection substrate and having a length extending in the direction orthogonal to the direction in which the camera module moves in the translation motion.

6. The optical assembly of claim 2, wherein the first section comprises a curved portion disposed around the hinge portion in a curved shape, and disposed in a space between the camera module and the bottom surface of the housing, and
   wherein the rigidity reduction portion is disposed in the curved portion.

7. The optical assembly of claim 6, wherein the rigidity reduction portion is disposed in a portion of the curved portion disposed on a side of the camera module.

8. The optical assembly of claim 2,
   wherein the hinge portion has a cylindrical shape,
   wherein the first section comprises a straight portion formed in a straight line shape and extending in a length direction of the hinge portion, and the rigidity reduction portion is disposed in a region of the straight portion extending parallel to the hinge portion.

9. The optical assembly of claim 8, wherein the straight portion is disposed on the bottom surface of the housing.

10. The optical assembly of claim 1, wherein the rigidity reduction portion comprises at least one slit penetrating through the connection substrate and formed in a length direction of the connection substrate.

11. The optical assembly of claim 10, wherein a length of the slit is greater than a width of the connection substrate.

12. The optical assembly of claim 10, wherein the connection substrate further comprises an insulating layer and a wiring pattern disposed on the insulating layer, and
wherein the wiring pattern is disposed on only one surface of the insulating layer in a region of the insulating layer on which the rigidity reduction portion is not disposed, and
wherein the wiring pattern is disposed on the one surface of the insulating layer and another surface of the insulating layer, in a region of the insulating layer on which the rigidity reduction portion is disposed.

13. The optical assembly of claim 12, wherein the connection substrate further comprises an interlayer connection conductor connecting a part of the wiring pattern disposed on the one surface of the insulating layer and a part of the wiring pattern disposed on the other surface of the insulating layer to each other.

14. The optical assembly of claim 13, wherein the connection substrate further comprises a rigid substrate portion in which rigid insulators are stacked on the one surface of the insulating layer and the other surface of the insulator.

15. The optical assembly of claim 14, wherein the rigid substrate portion is formed in a region of the connection substrate in which the interlayer connection conductor is disposed.

16. The optical assembly of claim 1, wherein the connection substrate further comprises a first connection substrate and a second connection substrate having a same configuration, and
wherein the first connection substrate and the second connection substrate are disposed to be point-symmetric to each other.

* * * * *